(12) United States Patent
Chen et al.

(10) Patent No.: US 10,466,295 B2
(45) Date of Patent: Nov. 5, 2019

(54) ELECTRICAL TEST FIXTURE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Han Chen, Beijing (CN); Peihuan Ning, Beijing (CN); Wei Sun, Beijing (CN); Bin Wan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 104 days.

(21) Appl. No.: 15/674,336

(22) Filed: Aug. 10, 2017

(65) Prior Publication Data

US 2018/0080977 A1 Mar. 22, 2018

(30) Foreign Application Priority Data

Sep. 18, 2016 (CN) ...................... 2016 2 1061109 U

(51) Int. Cl.
*G01R 31/28* (2006.01)
*G01R 1/04* (2006.01)

(52) U.S. Cl.
CPC ....... *G01R 31/2808* (2013.01); *G01R 1/0416* (2013.01); *G01R 1/0466* (2013.01)

(58) Field of Classification Search
CPC . G01R 31/2808; G01R 1/0466; G01R 1/0416
USPC ...................................... 324/756.02; 439/501
See application file for complete search history.

(56) References Cited

U.S. PATENT DOCUMENTS

| | | | |
|---|---|---|---|
| 2011/0076881 A1* | 3/2011 | Fleisig | H01R 13/6658 439/501 |
| 2011/0294323 A1* | 12/2011 | Yu | G06K 7/0021 439/159 |

\* cited by examiner

*Primary Examiner* — Farhana A Hoque
(74) *Attorney, Agent, or Firm* — Brooks Kushman P.C.

(57) ABSTRACT

The present disclosure provides an electrical test fixture, comprising a base provided with an accommodating slot for accommodating therein a circuit board to be detected, and a printed circuit board for providing an electrical test signal, the accommodating slot being provided therein with a connector electrically connected to the printed circuit board; and an upper cover movably connected to the base in a first state in which the upper cover is opened in such a manner that the circuit board to be detected is capable of being placed in the accommodating slot and in a second state in which the upper cover is engaged with the base and is capable of abutting against the circuit board to be detected in the accommodating slot in such a manner that the circuit board to be detected comes into contact and is connected with the connector.

9 Claims, 3 Drawing Sheets

ELECTRICAL TEST FIXTURE

CROSS-REFERENCE TO RELATED APPLICATION

This application claims a priority to Chinese Patent Application No. 201621061109.7 filed on Sep. 18, 2016, the disclosures of which are incorporated in their entirety by reference herein.

TECHNICAL FIELD

The present disclosure relates to the field of display device manufacturing technology, in particular to an electrical test fixture.

BACKGROUND

At present, in the process of manufacturing a liquid crystal display panel, it is required to perform an electrical test on a flexible printed circuit (FPC) board of the display panel. In a production line of the display panel, one approach to carrying out the electrical test is to plug the FPC board into a printed circuit board assembly (PCBA) of an electrical testing device so as to test product functions. This approach suffers from such defects as high requirements of an operator's operating capability, difficult plugging operation, long operation time (about 30 seconds), high misjudgment rate (about 1%) caused by poor plug-in connection, high scrap rate for PCBAs (about one PCBA scrapped for 100 pieces), and high cost for a single piece. As a result, the product cost is high and a first pass yield (FPY) is adversely affected.

SUMMARY

An object of the present disclosure is to provide an electrical test fixture so as to simplify the test operation and improve the efficiency of the operation, reduce production cost and increase FPY.

in an aspect, the present disclosure provides in an embodiment an electrical test fixture including: a base provided with an accommodating slot for accommodating therein a circuit board to be detected, and a printed circuit board for providing an electrical test signal, the accommodating slot being provided therein with a connector electrically connected to the printed circuit board; and an upper cover movably connected to the base in a first state in which the upper cover is opened in such a manner that the circuit board to be detected is capable of being placed in the accommodating slot and in a second state in which the upper cover is engaged with the base and is capable of abutting against the circuit board to be detected in the accommodating slot in such a manner that the circuit board to be detected comes into contact and is connected with the connector.

In some embodiments of the present disclosure, the connector is an ejector pin connector that includes a plurality of ejector pins in contact with the circuit board to be detected. The accommodating slot is provided with a plurality of mounting holes, and each ejector pin of the ejector pin connector is received in the mounting hole.

In some embodiment of the present disclosure, the base includes a base body having a groove structure, and at least one movable block arranged at the bottom of the groove structure, the movable block is movable in a reciprocating manner along a direction perpendicular to the bottom of the groove structure, and the accommodating slot is formed in the movable block. in the first state, the movable block is located at a first position and each ejector pin of the ejector pin connector is completely received in the mounting hole; and in the second state, the movable block is moved downward to a second position along the direction perpendicular to the bottom of the groove structure under an action of a pressure applied by the upper cover, and an end contact point of each ejector pin of the ejector pin connector extends out of the mounting hole in the accommodating slot.

In some embodiments of the present disclosure, a first spring is provided between the movable block and the base body.

In some embodiments of the present disclosure, the ejector pin connector further includes an inner cylinder which is received in the mounting hole and within which the ejector pin is disposed, and the inner cylinder includes a base end connected with the printed circuit board, and a second spring is provided between the base end and the ejector pin.

In some embodiments of the present disclosure, the upper cover includes a cover body and a protruding press block provided on the cover body, having a shape matching the structure of the accommodating slot and configured to abut the circuit board to be detected against the connector, and a position of the protruding press block corresponds to that of the accommodating slot.

In some embodiments of the present disclosure, the protruding press block includes a pressing surface in contact with the circuit board to be detected, and is movably connected to the cover body and movable in a reciprocating manner along a direction perpendicular to the pressing surface relative to the cover body.

In some embodiments of the present disclosure, a third spring is provided between the protruding press block and the cover body.

In some embodiments of the present disclosure, the upper cover is connected with the base through a pivot shaft, and the upper cover is rotatable around the pivot shaft to form a clip structure that is capable of being opened and closed.

In some embodiments of the present disclosure, the base is further provided with a snap-on structure configured to fasten the upper cover to the base.

The embodiments of the present disclosure at least have the following advantageous effects. The electrical test fixture according to the present disclosure facilitates the function test of a product since it is only required to place the circuit board to be detected in the accommodating slot in the base and close and fasten the upper cover to the base when the electrical test is performed. Moreover, by using the connector to connect the circuit board to be detected with the detection circuit board, it is able to reduce the loss of the detection circuit board. In addition, the fixture is stable during the test and therefore can be used for a long time, which leads to a reduced misjudgment rate at a testing station and makes it possible to effectively improve the operational efficiency, reduce the production cost and increase the FPY.

DETAILED DESCRIPTION

Figure 1:
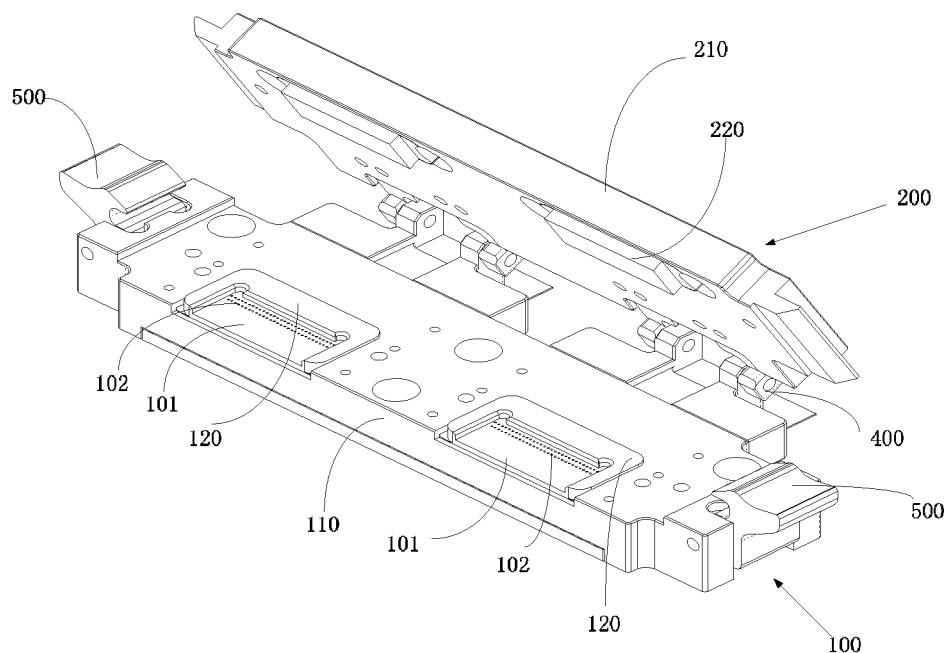
FIG. 1 is a schematic perspective view showing an electrical test fixture according to an embodiment of the present disclosure.
Figure 2:
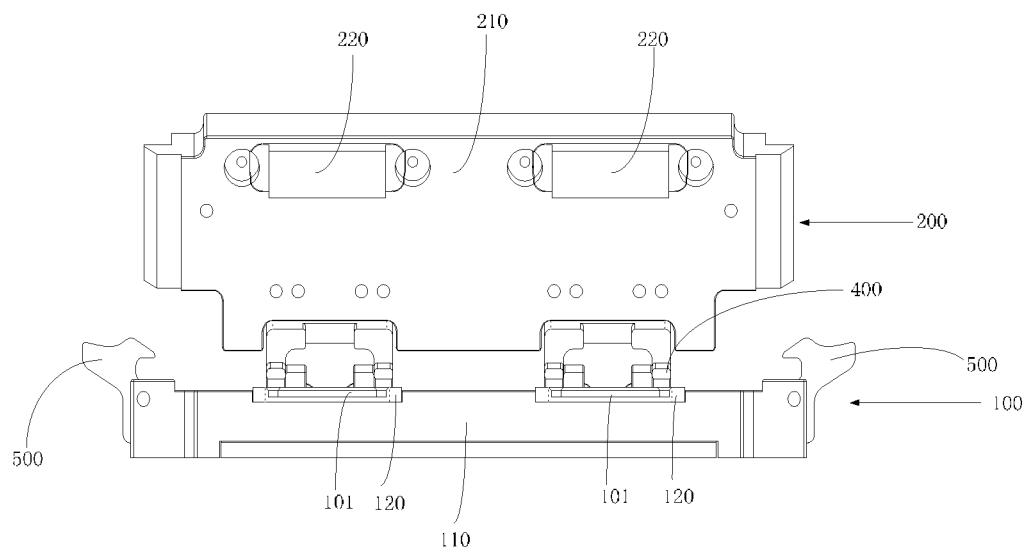
FIG. 2 is a front view of the electrical test fixture according to the embodiment of the present disclosure.
Figure 3:
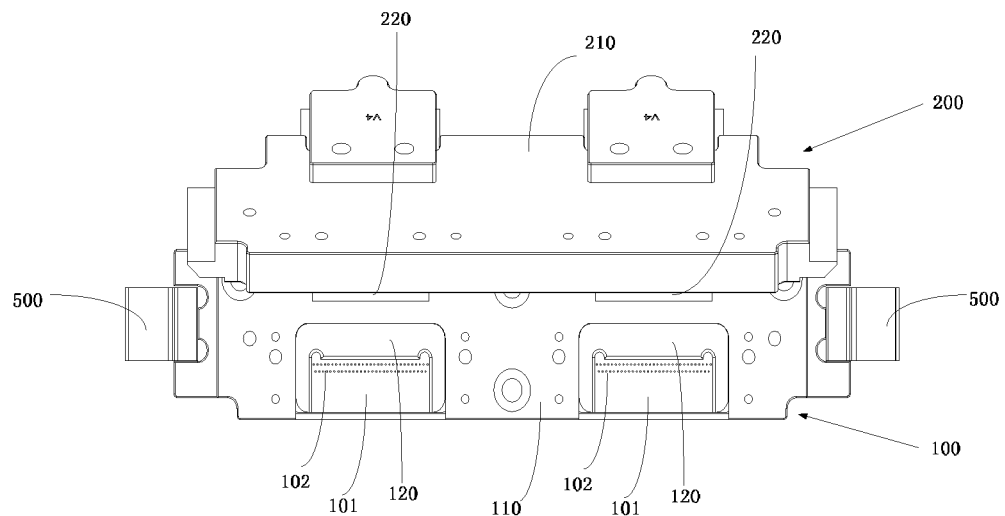
FIG. 3 is a top view of the electrical test fixture according to the embodiment of the present disclosure.
Figure 4:
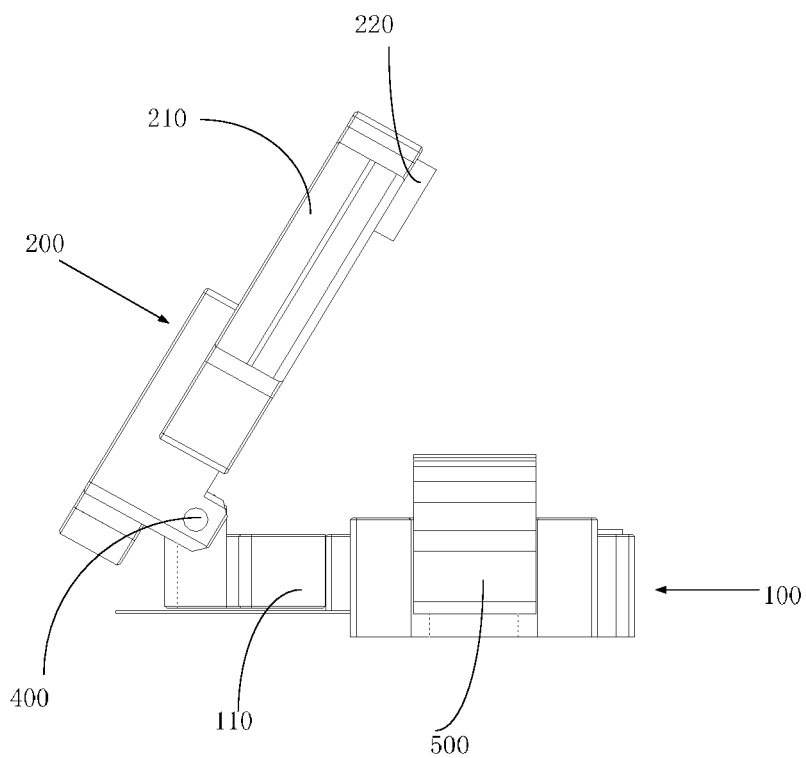
FIG. 4 is a left view of FIG. 2.
Figure 5:
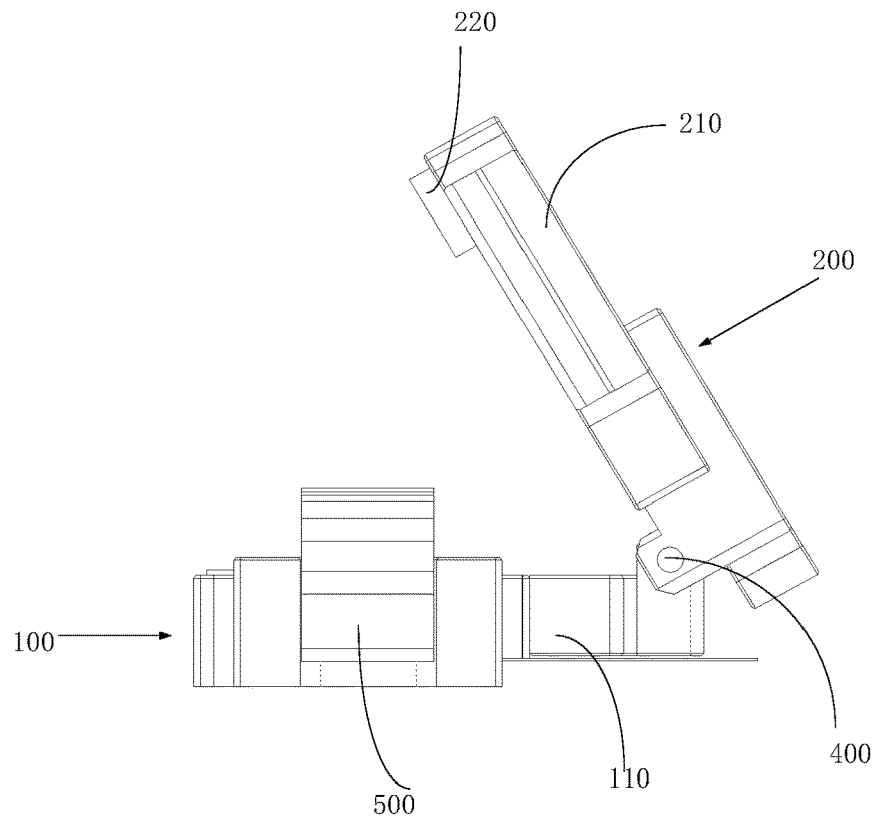
FIG. 5 is a right view of FIG. 2.

In order to make the objects, the technical solutions and the advantages of the present disclosure more apparent, the technical solutions of the embodiments of the present disclosure will be described hereinafter in a clear and complete manner in conjunction with the drawings of the embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In order to solve the problems of the difficult plugging operation when plugging a flexible printed circuit board into a printed circuit board, high misjudgment rate, high scrap rate of printed circuit boards, high production cost, and the like when carrying out an electrical test on a display panel, the present disclosure provides in some embodiment an electrical test fixture which allows a simple test operation and enables improved operational efficiency, reduced production cost and increased FPY.

As shown in FIGS. 1 to 6, the electrical test fixture according to the embodiments of the present disclosure comprises: a base 100 that is provided with an accommodating slot 101 for accommodating therein a circuit board to be detected, and a printed circuit board for providing an electrical test signal, the accommodating slot 101 being provided therein with a connector electrically connected to the printed circuit board; and an upper cover 200 movably connected to the base 100 in a first state and a second state. In the first state, the upper cover 200 is opened in such a manner that the circuit board to be detected is capable of being placed in the accommodating slot 101; and in the second state, the upper cover 200 is engaged with the base 100 and is capable of abutting against the circuit board to be detected in the accommodating slot 101 in such a manner that the circuit board to be detected comes into contact and is connected with the connector. The base 100 may be made of an engineering plastic, and the printed circuit board may be directly integrated within the base 100 and electrically connected with the connector.

In the electrical test fixture according to the present disclosure, the base 100 is provided with the accommodating slot 101, and the connector connected with the detection circuit board, such as a printed circuit board assembly (PBCA), is provided in the accommodating groove 101. When the circuit board to be detected, such as a flexible printed circuit board of a display panel, is placed in the accommodating slot 101, and the upper cover 200 is engaged with the base 100, the upper cover 200 presses the circuit board to be detected in the accommodating slot 101 against the connector so as to achieve the connection between the circuit board to be detected and the detection circuit board.

When carrying out an electrical test with the electrical test fixture according to the present disclosure, it is only required to place the circuit board to be detected in the accommodating slot 101 in the base 100 and then engage the upper cover 200 on the base 100, to complete the functional test of the product. Thus, the operation is simplified, the operation time is greatly reduced, and the operational efficiency is significantly improved. And furthermore, the service life is extended (at least 30,000 times), and the cost of a single piece is reduced. Moreover, the connector is provided as a bridge between the circuit board to be detected and the detection printed circuit board, the detection printed circuit board assembly (PCBA) can be protected, thereby stabilizing the test, lowering misjudgment rate, prolonging the service life, and increasing the FPY.

In the embodiments according to the present disclosure, optionally, as shown in FIGS. 1 to 6, the connector is an ejector pin connector that includes a plurality of ejector pins 601 in contact with the circuit board to be detected, the accommodating slot 101 is provided with a plurality of mounting holes 102, and each ejector pin 601 of the ejector pin connector is received in the mounting hole 102.

In the above embodiment, the connector is the ejector pin connector, which may be for example a Pogo pin connector, and the circuit board to be detected in the product to be detected is detected by integrating the ejector pin connector with the detection printed circuit board. Thus, the structure is simple, and the performance is stable. It shall be appreciated that the connector in other embodiments of the present disclosure may be any other connectors which will not be listed here.

In the embodiment of the present disclosure, optionally, as shown in FIGS. 1 to 6, the base 100 includes a base body 110 having a groove structure and at least one movable block 120 arranged at the bottom of the groove structure, the at least one movable block 120 is movable in a reciprocating manner along a direction perpendicular to the bottom of the groove structure, and the accommodating slot 101 is formed in the movable block 120 that includes at least one mounting holes 102.

In the first state, the movable block 120 is located at a first position and each ejector pin 601 of the ejector pin connector is completely received in the mounting hole 102; and in the second state, the movable block 120 is moved downward to a second position along the direction perpendicular to the bottom of the groove structure under an action of a pressure applied by the upper cover 200, and an end contact point of the ejector pin 601 of the ejector pin connector extends out of the mounting hole 102 in the accommodating slot 101.

In the above embodiment, the movable block 120 may be moved up and down on the base 100. When performing the electrical test, the circuit board to be detected is placed on the movable block 120, and when the upper 200 is opened, the movable block 120 moves upward, each ejector pin 601 of the ejector pin connector is completely received in the mounting hole 102 such that it is under protection. When the upper cover 200 is engaged, the movable block 120 will be pressed by the upper cover 200 such that the end contact point of the ejector pin 601 of the ejector pin connector extends out of the mounting hole 102 to make contact with the circuit board to be detected on the movable block 120.

In the embodiments according to the present disclosure, optionally, a first spring is arranged between the movable block 120 and the base body 110. The first spring may function to restore the movable block 120 when the upper cover 200 is opened, and resiliently buffer the movable block 120 when the upper cover 200 is closed to press the movable block 120, so as to better protect the ejector pin connector and the detection printed circuit board. There may be one or more first springs.

Figure 6:
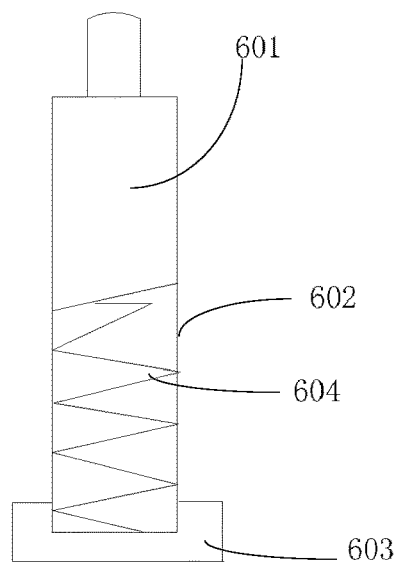
FIG. 6 is a structural schematic view of an ejector pin connector in the electrical test fixture according to the embodiment of the present disclosure.

In the embodiments according to the present disclosure, optionally, as shown in FIG. 6, the ejector pin connector further includes an inner cylinder 602 which is received in the mounting hole 102 and within which the ejector pin 601 is disposed. The inner cylinder 602 includes a base end 603 configured to connect with the printed circuit board. A second spring 604 is provided between the base end 603 and the ejector pin 601.

In the above embodiment, the ejector pin connector may be a spring pin connector. When a conventional spring pin connector is directly used to be mounted in the mounting hole 102 in the accommodating slot 101, the inner cylinder 602 is placed in the mounting hole 102, and the base end 603 of the inner cylinder 602 is connected with a detection circuit board, such as a printed circuit board, the assembly is easy and the structure is simple.

It shall be appreciated that, in a practical application, the ejector pin connector may be any other connectors which are not defined herein.

Furthermore, in the embodiments according to the present disclosure, optionally, as shown in FIGS. 1 to 6, the upper cover 200 includes a cover body 210 and a protruding press block 220 provided on the cover body 210, having a shape matching the structure of the accommodating slot 101 and configured to abut the circuit board to be detected against the connector, and a position of the press block 220 corresponds to that of the accommodating slot 101. In this case, when the upper cover 200 is closed, the protruding press block 220 on the upper cover 200 may press the circuit board to be detected in the accommodating slot 101 and then press down the movable block 120.

In some embodiments according to the present disclosure, optionally, the protruding press block 220 includes a pressing surface in contact with the circuit board to be detected, and the protruding press block 220 is movably connected to the cover body 210 and movable in a reciprocating manner along a direction perpendicular to the pressing surface relative to the cover body 210. A third spring is provided between the protruding press block 220 and the cover body 210.

In this case, the protruding press block 220 can be moved up and down relative to the cover body 210, and the third spring arranged between the protruding press block 220 and the cover body 210 may act as a buffer for protecting the circuit board to be detected, the ejector pin 601 and the detection circuit board at the time of pressing and making contact.

In the embodiments according to the present disclosure, optionally, as shown in FIGS. 1 to 6, the upper cover 200 is connected to the base 100 through a pivot shaft 400, and the upper cover 200 is rotatable around the pivot shaft 400 to form a clip structure that is capable of being opened and closed.

In this case, the upper cover 200 is connected with the base 100 in such a manner that it can turn over forward and backward, which provides a good visual effect, facilitates the placement of the circuit board product to be detected and also effectively prevents the collision between the product and the upper cover 200. It shall be appreciated that the upper cover 200 may be opened from or engaged with the base 100 in any other manners.

Furthermore, as shown in FIG. 1, optionally, the base 100 is further provided with a snap-on structure 500 configured to fasten the upper cover 200 to the base 100. After the upper cover 200 is closed, it may be fastened to the base 100 by means of the snap-on structure 500, and when the electrical test is over, the snap-on structure 500 may be opened to allow the upper cover 200 to be opened.

In addition, it shall be noted that, the electrical test fixture according to the present disclosure may be applied to the detection of a flexible printed circuit board of a display panel. Specifically, it may be applied to a bonding test of a one glass solution (OGS) touch screen, including engineering test evaluation (ETE) products, evaluation test procedure (ETP) products and the like.

Further, the electrical test fixture according to the present disclosure may further include a carrying table for carrying a display panel thereon, wherein the base 100 and the upper cover 200 are mounted on the carrying table at positions corresponding to the position of the flexible printed circuit board, and there may be two or more accommodating slots 101 in the base 100.

The above are merely optional embodiments of the present disclosure. It shall be indicated that a person skilled in the art may make several improvements and replacements without departing from the technical principle of the present disclosure, and these improvements and replacements should be also regarded as falling within the protection scope of the present disclosure.

What is claimed is:

1. An electrical test fixture, comprising:
   a base provided with an accommodating slot for accommodating therein a circuit board to be detected, and a printed circuit board for providing an electrical test signal, the accommodating slot being provided therein with a connector electrically connected to the printed circuit board; and
   an upper cover movably connected to the base in a first state in which the upper cover is opened in such a manner that the circuit board to be detected is capable of being placed in the accommodating slot, and in a second state in which the upper cover is engaged with the base and is capable of abutting against the circuit board to be detected in the accommodating slot in such a manner that the circuit board to be detected comes into contact and is connected with the connector;
   wherein the connector is an ejector pin connector that comprises a plurality of ejector pins in contact with the circuit board to be detected, and the accommodating slot is provided with a plurality of mounting holes, and each ejector pin of the ejector pin connector is received in the mounting hole;
   wherein the base comprises a base body having a groove structure, and at least one movable block arranged at the bottom of the groove structure, the at least one movable block is movable in a reciprocating manner along a direction perpendicular to the bottom of the groove structure, and the accommodating slot is formed in the movable block; and
   wherein in the first state, the movable block is located at a first position and each ejector pin of the ejector pin connector is completely received in the mounting hole; and in the second state, the movable block is moved downward to a second position along the direction perpendicular to the bottom of the groove structure under an action of a pressure applied by the upper cover, and an end contact point of each ejector pin of the ejector pin connector extends out of the mounting hole in the accommodating slot.

2. The electrical test fixture according to claim 1, wherein a first spring is provided between the movable block and the base body.

3. The electrical test fixture according to 1, wherein the ejector pin connector further comprises an inner cylinder which is received in the mounting hole and within which the ejector pin is disposed, and the inner cylinder comprises a base end connected with the printed circuit board, and a second spring is provided between the base end and the ejector pin.

4. The electrical test fixture according to claim 1, wherein the upper cover comprises a cover body and a protruding press block provided on the cover body, the protruding press block having a shape matching the structure of the accommodating slot and configured to abut the circuit board to be detected against the connector, and a position of the protruding press block corresponds to that of the accommodating slot.

5. The electrical test fixture according to claim 4, wherein the protruding press block comprises a pressing surface in contact with the circuit board to be detected, and is movably connected to the cover body and movable relative to the cover body in a reciprocating manner along a direction perpendicular to the pressing surface.

6. An electrical test fixture, comprising:
a base provided with an accommodating slot for accommodating therein a circuit board to be detected, and a printed circuit board for providing an electrical test signal, the accommodating slot being provided therein with a connector electrically connected to the printed circuit board; and
an upper cover movably connected to the base in a first state in which the upper cover is opened in such a manner that the circuit board to be detected is capable of being placed in the accommodating slot, and in a second state in which the upper cover is engaged with the base and is capable of abutting against the circuit board to be detected in the accommodating slot in such a manner that the circuit board to be detected comes into contact and is connected with the connector;
wherein the connector is an ejector pin connector that comprises a plurality of ejector pins in contact with the circuit board to be detected, and the accommodating slot is provided with a plurality of mounting holes, and each ejector pin of the ejector pin connector is received in the mounting hole; and
wherein the ejector pin connector further comprises an inner cylinder which is received in the mounting hole and within which the ejector pin is disposed, and the inner cylinder comprises a base end connected with the printed circuit board, and a second spring is provided between the base end and the ejector pin.

7. The electrical test fixture according to claim 6, wherein the upper cover comprises a cover body and a protruding press block provided on the cover body, the protruding press block having a shape matching the structure of the accommodating slot and configured to abut the circuit board to be detected against the connector, and a position of the protruding press block corresponds to that of the accommodating slot.

8. The electrical test fixture according to claim 7, wherein the protruding press block comprises a pressing surface in contact with the circuit board to be detected, and is movably connected to the cover body and movable relative to the cover body in a reciprocating manner along a direction perpendicular to the pressing surface.

9. The electrical test fixture according to claim 8, wherein a third spring is provided between the protruding press block and the cover body.

* * * * *